(12) United States Patent
Masada et al.

(10) Patent No.: US 12,330,251 B2
(45) Date of Patent: Jun. 17, 2025

(54) HOLDING UNIT

(71) Applicant: DISCO CORPORATION, Tokyo (JP)

(72) Inventors: Takayuki Masada, Tokyo (JP); Tomohito Matsuda, Tokyo (JP); Yuhei Fujii, Tokyo (JP); Naoya Takesue, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 341 days.

(21) Appl. No.: 18/299,327

(22) Filed: Apr. 12, 2023

(65) Prior Publication Data

US 2023/0339055 A1 Oct. 26, 2023

(30) Foreign Application Priority Data

Apr. 20, 2022 (JP) .................................. 2022-069207

(51) Int. Cl.
*B23Q 1/56* (2006.01)
*H01L 21/687* (2006.01)

(52) U.S. Cl.
CPC .......... *B23Q 1/56* (2013.01); *H01L 21/68721* (2013.01); *H01L 21/68728* (2013.01); *H01L 21/68785* (2013.01)

(58) Field of Classification Search
CPC . H01L 21/683; H01L 21/6835; H01L 21/687; H01L 21/68707; H01L 21/68721; H01L 21/68728; H01L 21/68771; H01L 21/68778
See application file for complete search history.

(56) References Cited

U.S. PATENT DOCUMENTS

| | | | | |
|---|---|---|---|---|
| 4,898,639 A | * | 2/1990 | Moe | H01L 21/67028 156/345.55 |
| 5,775,000 A | * | 7/1998 | Maekawa | H01L 21/68728 134/902 |
| 5,778,554 A | * | 7/1998 | Jones | H01L 21/67034 34/58 |
| 2017/0236730 A1 | * | 8/2017 | Imamura | H01L 21/67253 134/57 R |
| 2019/0126427 A1 | * | 5/2019 | Kato | B24B 37/20 |

FOREIGN PATENT DOCUMENTS

| | | |
|---|---|---|
| JP | 2005129607 A | 5/2005 |
| JP | 2020096177 A | 6/2020 |
| JP | 2021015998 A | 2/2021 |

* cited by examiner

*Primary Examiner* — Tyrone V Hall, Jr.
(74) *Attorney, Agent, or Firm* — Greer Burns & Crain Ltd.

(57) ABSTRACT

There is provided a holding unit that holds a target object by a holding surface of a holding table. The holding unit includes a fixing mechanism that fixes the target object to the holding surface, a movement mechanism that moves the fixing mechanism, and a controller. The fixing mechanism includes a fastening member allowed to be disposed at a fixing position at which the fastening member fastens the target object and fixes the target object to the holding surface and a release position at which the fastening member releases the target object and a biasing member that biases the fastening member toward the side of the fixing position. The movement mechanism includes a pressing member that presses the fastening member and an actuator that moves the pressing member to position the fastening member to the release position.

2 Claims, 6 Drawing Sheets

HOLDING UNIT

BACKGROUND OF THE INVENTION

Field of the Invention

The present invention relates to a holding unit that holds a target object by a holding surface of a holding table.

Description of the Related Art

In a process of manufacturing device chips, a wafer in which a device is formed in each of a plurality of regions marked out by a plurality of streets (planned dividing lines) arranged in a lattice manner is used. Chips each including the device (device chips) are obtained by dividing the wafer along the streets. The device chips are incorporated into various kinds of electronic equipment such as mobile phones and personal computers.

For the dividing of the wafer, a cutting apparatus that cuts the wafer by an annular cutting blade is used. Meanwhile, in recent years, development of a process of dividing a wafer by laser processing by use of a laser processing apparatus has also been advanced. For example, Japanese Patent Laid-open No. 2005-129607 discloses a method in which a laser beam having transmissibility with respect to a wafer is focused inside the wafer and a modified layer (altered layer) is formed inside the wafer along streets. The region in which the modified layer is formed in the wafer becomes more fragile than the other region. Thus, when an external force is applied to the wafer in which the modified layer is formed along the streets, the wafer breaks along the streets and is divided into a plurality of device chips.

When the wafer is divided by application of the external force, dust generated in a breakage surface at the time of the dividing is scattered and adheres to the wafer, which causes the lowering of the quality of the wafer or the device chips. As such, a dividing apparatus that divides a wafer in the state in which the wafer is held in such a manner as to be oriented downward has been proposed (refer to Japanese Patent Laid-open No. 2020-96177 and Japanese Patent Laid-open No. 2021-15998). When this dividing apparatus is used, the dust generated at the time of the dividing of the wafer drops to the lower side of the wafer, and therefore, the dust becomes less liable to adhere to the wafer that has been divided. Further, the divided wafer is conveyed to a cleaning unit mounted in the dividing apparatus, the cleaning unit holds the wafer, with the wafer oriented downward, and cleans the wafer.

SUMMARY OF THE INVENTION

A holding table that holds a workpiece at the time of processing or cleaning of the workpiece is mounted in processing apparatuses such as a cutting apparatus and a laser processing apparatus. The holding table includes a holding surface that holds a target object, and a plurality of clamp mechanisms that fix the target object are disposed around the holding table. By supporting the target object by the holding surface and grasping an outer circumferential part of the target object by the plurality of clamp mechanisms, the target object is held by the holding table.

The clamp mechanisms each include a fastening member that fastens the target object and fixes it to the holding surface of the holding table, and the fastening member is biased by a biasing member such as a coil spring. When the target object is held by the holding table, the fastening members are pressed against the target object by a biasing force (restoring force) applied from the biasing members to the fastening members, and the target object is fixed to the holding surface of the holding table. On the other hand, when the target object is conveyed from the holding table, the fastening members are moved in such a direction as to go against the biasing force of the biasing members, by application of an external force. This causes the fastening members to separate from the target object, and the target object is released.

However, if the deterioration of the biasing member over time or breakdown thereof occurs, a sufficient biasing force is not applied from the biasing member to the fastening member, and the fixing of the target object by the clamp mechanism becomes incomplete. As a result, the target object is not properly held in processing or cleaning, and processing failure or cleaning failure occurs in some cases. In particular, when the holding table holds the target object with the target object oriented downward, there is a possibility that the target object drops due to an abnormality of the clamp mechanism and damage that is impossible to repair occurs in the target object. Hence, in the case of using the clamp mechanisms for holding the target object, it is required to monitor the state of the clamp mechanisms and immediately execute check, repair, replacement, or the like of the clamp mechanism when an abnormality occurs in the clamp mechanism. However, it is difficult to determine the deterioration or breakdown of the biasing member from the appearance in many cases, and finding of an abnormality of the clamp mechanism tends to be late. As a result, processing or cleaning is continued with holding of the target object remaining incomplete, and avoidance of processing failure or cleaning failure is impossible in some cases.

The present invention is made in view of such a problem, and an object thereof is to provide a holding unit that allows inspection of whether or not a target object can properly be held by a holding table.

In accordance with an aspect of the present invention, there is provided a holding unit that holds a target object by a holding surface of a holding table. The holding unit includes a fixing mechanism that fixes the target object to the holding surface, a movement mechanism that moves the fixing mechanism, and a controller. The fixing mechanism includes a fastening member allowed to be disposed at a fixing position at which the fastening member fastens the target object and fixes the target object to the holding surface and a release position at which the fastening member releases the target object and a biasing member that biases the fastening member toward the side of the fixing position. The movement mechanism includes a pressing member that presses the fastening member and an actuator that moves the pressing member to position the fastening member to the release position. The controller determines whether the biasing member is in a normal state or in an abnormal state, on the basis of a pressing force of the actuator, the pressing force being applied when the fastening member is moved from the fixing position to the release position.

Preferably, the biasing member is a helical torsion spring and the actuator is an air cylinder.

In the holding unit according to the aspect of the present invention, whether the biasing member is in the normal state or in the abnormal state is determined based on the pressing force of the actuator, the pressing force being applied when the fastening member is moved from the fixing position to the release position. This can immediately find an abnormality of the biasing member and prevent the occurrence of the situation in which processing, cleaning, or the like of the target object is continued with fixing of the target object remaining incomplete.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
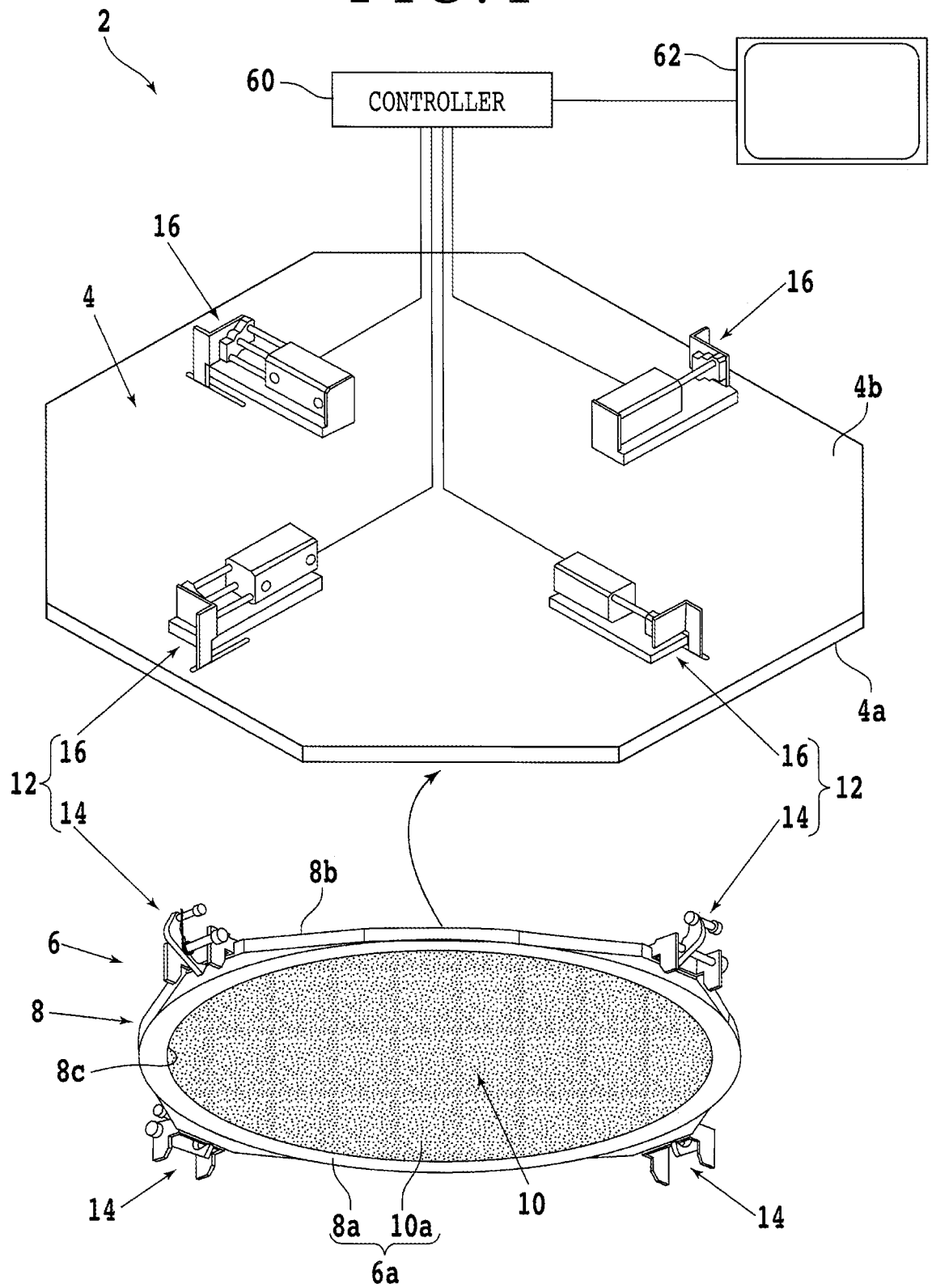
FIG. 1 is a perspective view illustrating a holding unit.

An embodiment according to one aspect of the present invention will be described below with reference to the accompanying drawings. First, a configuration example of a holding unit according to the present embodiment will be described. FIG. 1 is a perspective view illustrating a holding unit (holding mechanism) 2. For example, the holding unit 2 is mounted in various kinds of processing apparatuses such as a cutting apparatus, a grinding apparatus, a polishing apparatus, a laser processing apparatus, and a plasma treatment apparatus and holds a target object to be processed or cleaned by the processing apparatus.

The holding unit 2 includes a plate-shaped base 4. The base 4 is composed of metal, glass, ceramic, resin, or the like and includes a first surface (lower surface) 4a and a second surface (upper surface) 4b substantially parallel to each other. A holding table (chuck table) 6 that holds a predetermined target object is disposed on the side of the first surface 4a of the base 4. In FIG. 1, the base 4 and the holding table 6 are separated from each other and are illustrated at different angles for convenience of explanation.

Figure 2:
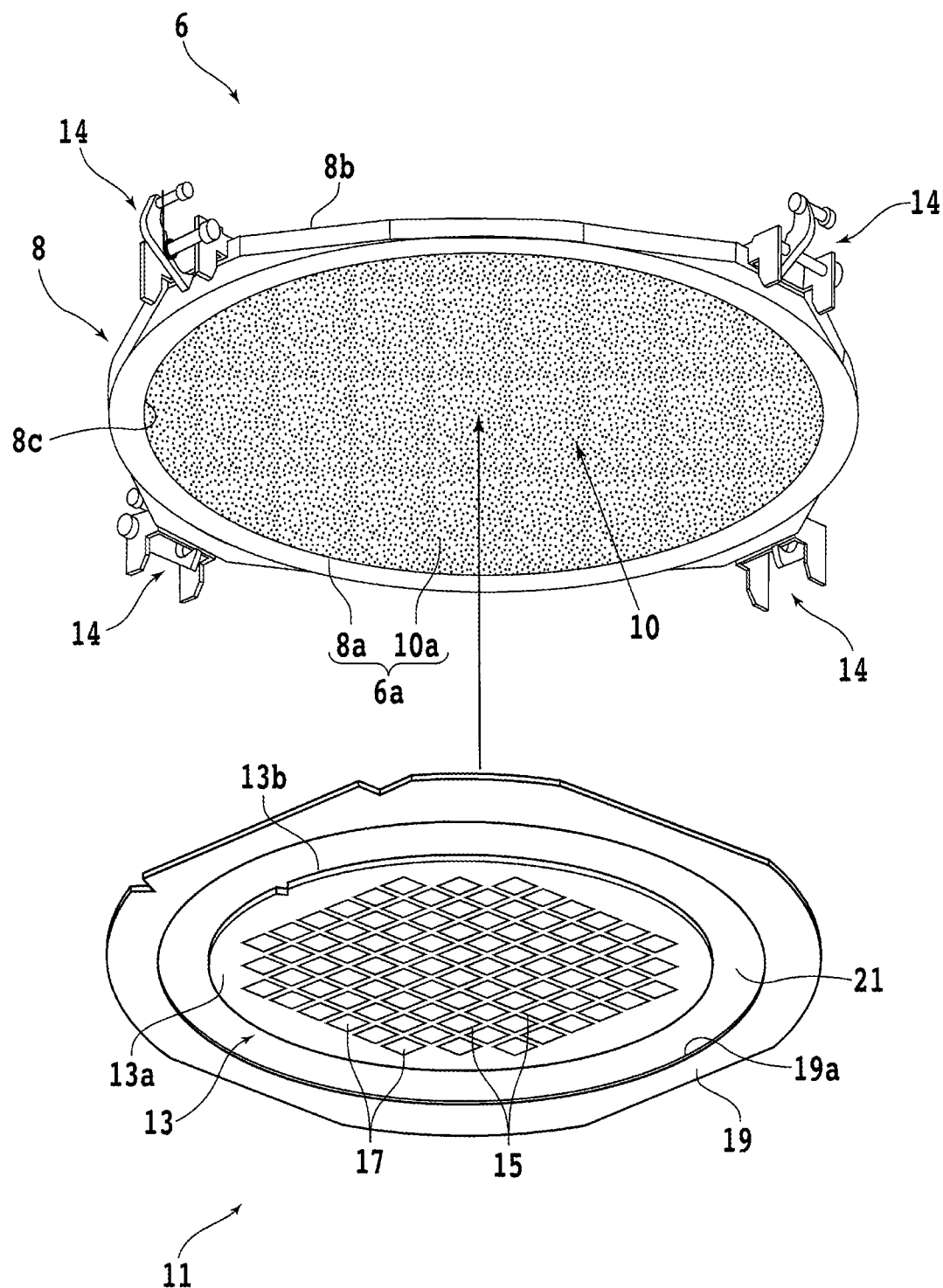
FIG. 2 is a perspective view illustrating a holding table.

FIG. 2 is a perspective view illustrating the holding table 6 that holds a target object 11. The target object 11 is a holding-target object to be held by the holding table 6, and the holding table 6 can hold various kinds of target object 11 according to the use purpose. When the holding table 6 is mounted in a processing apparatus, the target object 11 is equivalent to a workpiece to be processed by the processing apparatus and a cleaning-target object to be cleaned by the processing apparatus.

For example, the target object 11 includes a circular disc-shaped wafer 13 composed of a semiconductor material such as single-crystal silicon. The wafer 13 includes a front surface 13a and a back surface 13b substantially parallel to each other. Further, the wafer 13 is segmented into a plurality of rectangular regions by a plurality of streets (planned dividing lines) 15 arranged in a lattice manner to intersect each other. A device 17 such as an integrated circuit (IC), large scale integration (LSI), a light emitting diode (LED), or a micro electro mechanical systems (MEMS) device is formed in each of the plurality of regions marked out by the streets 15 on the side of the front surface 13a. For example, a plurality of device chips each including the device 17 are manufactured by dividing the wafer 13 along the streets 15 to dice the wafer 13 into individual pieces by using a processing apparatus such as a cutting apparatus, a laser processing apparatus, or a plasma treatment apparatus. Moreover, thinned device chips are obtained by thinning the wafer 13 by using a processing apparatus such as a grinding apparatus or a polishing apparatus before the dividing of the wafer 13. However, there is no limitation on the material, shape, structure, size, and so forth of the wafer 13. For example, the wafer 13 may be a substrate composed of a semiconductor other than silicon (gallium arsenide (GaAs), indium phosphide (InP), gallium nitride (GaN), silicon carbide (SiC), or the like), glass, ceramic, resin, metal, or the like. Further, there is no limitation also on the kind, quantity, shape, structure, size, arrangement, and so forth of the devices 17, and the devices 17 do not need to be formed in the wafer 13.

When the wafer 13 is processed or cleaned, the wafer 13 is supported by an annular frame 19 for convenience of handling of the wafer 13. The frame 19 is composed of such metal as stainless steel (SUS), for example, and a circular opening 19a that penetrates the frame 19 in the thickness direction is made at a central part of the frame 19. The diameter of the opening 19a is larger than that of the wafer 13. A sheet 21 is fixed to the wafer 13 and the frame 19. For example, a tape including a film-shaped base formed into a circular shape and an adhesive layer (glue layer) disposed on the base is used as the sheet 21. The base is composed of such resin as polyolefin, polyvinyl chloride, or polyethylene terephthalate, and the adhesive layer is composed of an epoxy-based, acrylic-based, or rubber-based adhesive, for example. The adhesive layer may be composed of an ultraviolet-curable resin.

In the state in which the wafer 13 is disposed inside the opening 19a of the frame 19, a central part of the sheet 21 is stuck to the side of the back surface 13b of the wafer 13, and an outer circumferential part of the sheet 21 is stuck to the frame 19. As a result, the wafer 13 is supported by the frame 19 through the sheet 21, and the target object 11 (wafer unit, frame unit) including the wafer 13, the frame 19, and the sheet 21 is configured. However, the configuration of the target object 11 is not limited to the configuration described above. For example, instead of the wafer 13, a package substrate such as a chip size package (CSP) substrate or a quad flat non-leaded package (QFN) substrate may be supported by the frame 19 through the sheet 21. The package substrate is formed by sealing, by a resin layer (mold resin), a plurality of device chips mounted on a base substrate. Package devices including the plurality of device chips made into a package are manufactured by dividing the package substrate to dice it into individual pieces. Further, the wafer 13 or the package substrate does not need to be supported by the frame 19 as long as there is no trouble in handling. In this case, the wafer 13 or the package substrate itself is equivalent to the target object 11.

The holding table 6 includes a circular disc-shaped frame body (main body part) 8 composed of such metal as SUS, glass, ceramic, resin, or the like. The frame body 8 includes a first surface (lower surface) 8a and a second surface (upper surface) 8b substantially parallel to each other. Moreover, a circular columnar recess part 8c is made at a central part of the frame body 8 on the side of the first surface 8a.

A circular disc-shaped holding member 10 formed of a porous member such as a porous ceramic is fitted into the recess part 8c. The holding member 10 includes a flow path including a plurality of pores that cause an upper surface and a lower surface of the holding member 10 to communicate with each other. The lower surface of the holding member 10 configures a circular suction surface 10a that sucks the target object 11 when the target object 11 is held by the holding table 6. The depth of the recess part 8c is substantially identical to the thickness of the holding member 10, and the first surface 8a of the frame body 8 and the suction surface 10a of the holding member 10 are disposed on substantially the same plane. Further, a holding surface (support surface) 6a that holds the target object 11 includes the first surface 8a of the frame body 8 and the suction surface 10a of the holding member 10. Moreover, the suction surface 10a is connected to a suction source (not illustrated) such as an ejector through the pores included in the holding member 10, a flow path (not illustrated) formed inside the frame body 8, a valve (not illustrated), and so forth.

For example, the target object 11 is disposed on the side of the holding surface 6a of the holding table 6 in such a manner that the side of the front surface 13a of the wafer 13 is exposed downward and the side of the back surface 13b of the wafer 13 (side of the sheet 21) faces the holding surface 6a. When a suction force (negative pressure) of the suction source is caused to act on the suction surface 10a in this state, the wafer 13 is held under suction by the holding table 6 with the interposition of the sheet 21.

However, there is no limitation on the configuration of the holding table that holds the target object 11. For example, it is also possible to use, instead of the holding table 6, a holding table in which grooves (suction grooves) for sucking the target object 11 are formed in a holding surface. This kind of holding table includes a circular disc-shaped member composed of metal, glass, ceramic, resin, or the like, and the front surface (lower surface) of the holding table configures the holding surface. Further, a plurality of suction grooves formed along the holding surface are made on the holding surface side of the holding table. For example, the plurality of suction grooves are formed into a straight line shape, a curve shape, or an annular shape across the whole of the holding surface of the holding table. Moreover, the plurality of suction grooves may be radially formed from the center of the holding table to the outer circumferential edge. In addition, the plurality of suction grooves are connected to a suction source through a suction path formed inside the holding table. By causing a suction force of the suction source to act on the plurality of suction grooves in the state in which the target object 11 is brought into contact with the holding surface, the target object 11 is held under suction by the holding surface of the holding table.

As illustrated in FIG. 1, the holding table 6 is installed on the lower side of the base 4 in such a manner that the second surface 8b of the frame body 8 faces the first surface 4a of the base 4. This causes the holding surface 6a of the holding table 6 to be disposed substantially in parallel to the first surface 4a and the second surface 4b of the base 4. The base 4 and the holding table 6 may be coupled to each other or may each be independently supported by different members.

Further, the holding unit 2 includes a plurality of clamp mechanisms 12 that grasp and fix an outer circumferential part of the target object 11. For example, the clamp mechanisms 12 are arranged at an outer circumferential part of the holding table 6 at substantially equal intervals along the circumferential direction of the holding table 6. In FIG. 1, an example in which four sets of the clamp mechanisms 12 are arranged at intervals of 90° is illustrated. However, the number and intervals of the clamp mechanisms 12 can freely be set.

The clamp mechanisms 12 each include a fixing mechanism 14 that fixes the target object 11 (see FIG. 2) to the holding surface 6a of the holding table 6 and a movement mechanism 16 that moves the fixing mechanism 14. For example, the fixing mechanisms 14 are mounted on an outer circumferential part of the frame body 8 of the holding table 6 and are disposed on the side of the first surface 4a (lower side) of the base 4 together with the holding table 6. On the other hand, the movement mechanisms 16 are disposed on the second surface 4b of the base 4. The fixing mechanisms 14 are configured to be switchable between a fixing state in which the fixing mechanisms 14 press the outer circumferential part (frame 19, see FIG. 2) of the target object 11 from the lower side toward the side of the holding surface 6a of the holding table 6 and a release state in which the fixing mechanisms 14 release the pressing of the outer circumferential part of the target object 11. When the fixing mechanisms 14 enter the fixing state, the outer circumferential part of the target object 11 is pressed against the side of the holding surface 6a of the holding table 6 from the lower side, and the target object 11 is fixed to the holding surface 6a. On the other hand, when the fixing mechanisms 14 enter the release state, the fixing mechanisms 14 separate from the outer circumferential part of the target object 11, and the fixing of the target object 11 is released.

Figure 3:
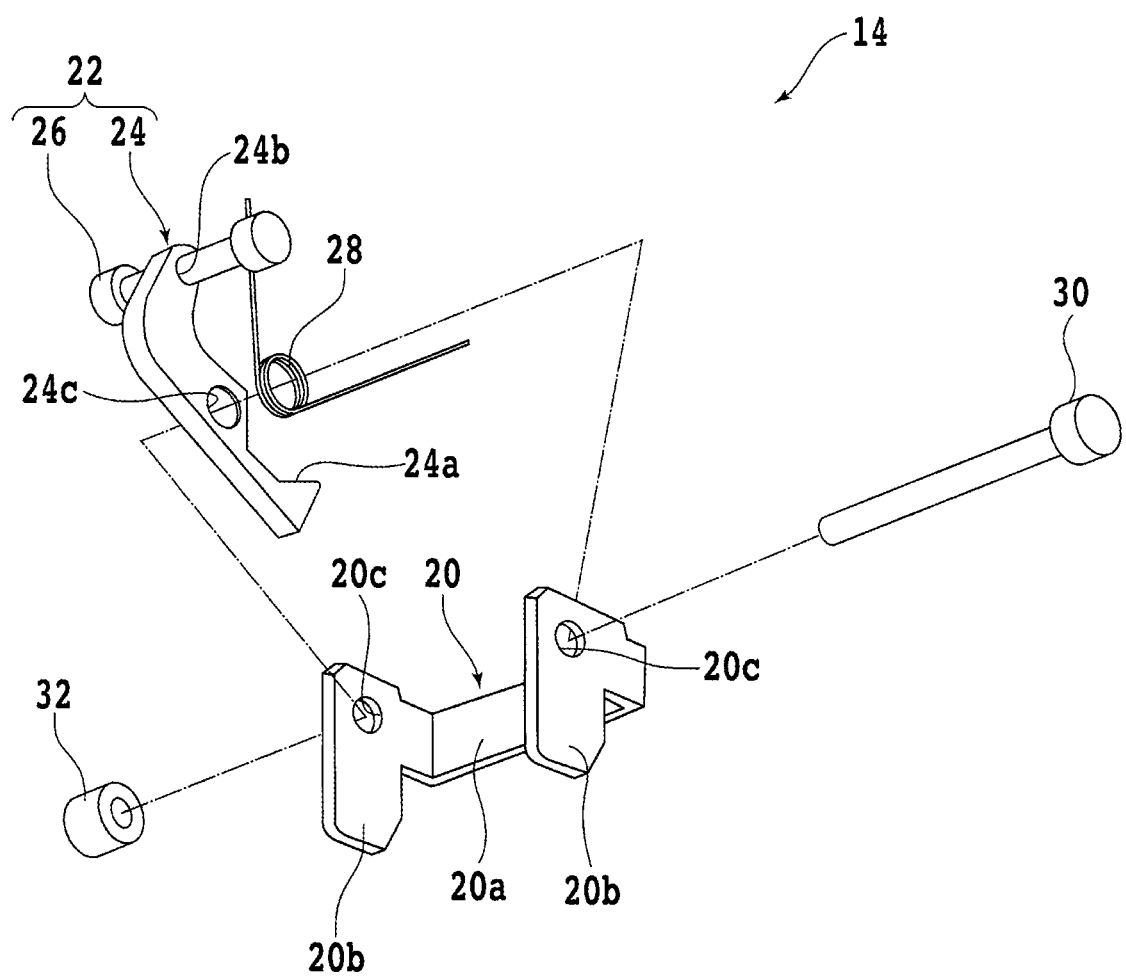
FIG. 3 is an exploded perspective view illustrating a fixing mechanism.

FIG. 3 is an exploded perspective view illustrating the fixing mechanism 14. The fixing mechanism 14 includes a fixed member 20 fixed to the outer circumferential part of the holding table 6 (see FIG. 1 and FIG. 2). The fixed member 20 includes a plate-shaped fixed part 20a formed into a rectangular shape and a pair of plate-shaped support parts 20b that protrude forward from end parts of the fixed part 20a on both sides. The fixed part 20a and the support parts 20b are disposed in such a manner as to be substantially perpendicular to each other, and the pair of support parts 20b are disposed substantially in parallel to each other. A circular through-hole 20c that penetrates the support part 20b in the thickness direction is made in each of the pair of support parts 20b.

On the fixed member 20, a fastening member 22 that fastens the target object 11 (see FIG. 2) and a biasing member 28 that presses and biases the fastening member 22 are mounted. The fastening member 22 includes a contact member 24 that gets contact with the outer circumferential part of the target object 11 (see FIG. 2) and fixes the target object 11 and a columnar pressed pin 26 coupled to the contact member 24. For example, the contact member 24 is formed into a substantially L-shape and is rotatably set between the pair of support parts 20b. A contact part 24a that gets contact with the target object 11 is disposed at one end part of the contact member 24. The contact part 24a is a projection part (protrusion part) that protrudes from the one end part of the contact member 24, and a tip part of the contact part 24a is formed into a curved surface shape. Further, the pressed pin 26 is coupled to the other end part of the contact member 24. For example, the pressed pin 26 is inserted into a through-hole 24b made at the other end part of the contact member 24 and is fixed to be along the thickness direction of the contact member 24. Moreover, a circular through-hole 24c that penetrates the contact member 24 in the thickness direction is made between the contact part 24a and the through-hole 24b of the contact member 24.

The biasing member 28 is coupled to the fastening member 22. The biasing member 28 is an elastic body such as a coil spring, and presses and biases the fastening member 22 by a restoring force. For example, a helical torsion spring (torsion spring, kick spring) is used as the biasing member 28. However, there is no limitation on the kind of biasing member 28 as long as the biasing member 28 can bias the fastening member 22.

The fastening member 22 and the biasing member 28 are disposed between the pair of support parts 20b. Further, a columnar support pin 30 is sequentially inserted into the through-hole 20c of one of the support parts 20b, the biasing member 28, the through-hole 24c of the contact member 24, and the through-hole 20c of the other of the support parts 20b, and a fastener 32 is mounted on a tip part of the support pin 30. As a result, the support pin 30 is fixed to the fixed member 20, and the fastening member 22 and the biasing member 28 are supported by the support pin 30. The fastening member 22 is supported by the support pin 30 in the state in which the fastening member 22 is rotatable around the support pin 30. Further, one end side of the biasing member 28 is fixed to the pressed pin 26, and the other end side of the biasing member 28 is fixed to, for example, an upper end part of the fixed part 20a of the fixed member 20. A member, such as a washer or cushion rubber, that restrains movement of the fastening member 22 and the biasing member 28 in the length direction of the support pin 30 may be mounted on the support pin 30.

When the pressed pin 26 is pressed toward the side of the fixed part 20a of the fixed member 20, the biasing member 28 gets deformed, and the fastening member 22 rotates in the pressing direction. This causes the contact part 24a of the contact member 24 to move to get further away from the fixed part 20a and causes the pressed pin 26 to move to get closer to the fixed part 20a. Further, when the pressing of the pressed pin 26 is released, the fastening member 22 rotates in a direction opposite to the direction in the pressing, due to the biasing force (restoring force) of the biasing member 28. This causes the contact part 24a of the contact member 24 to move to get closer to the fixed part 20a and causes the pressed pin 26 to move to get further away from the fixed part 20a.

Figure 4:
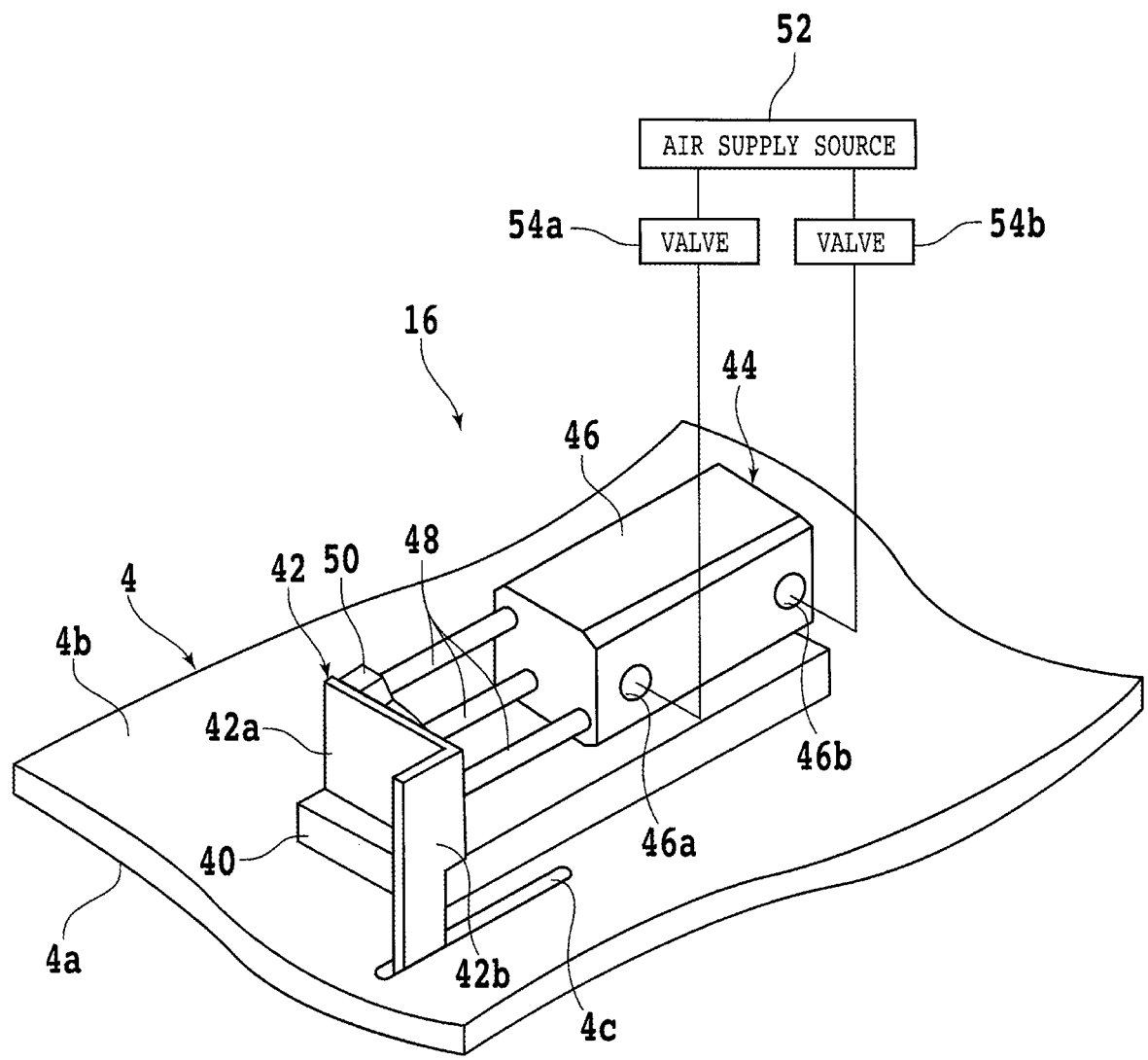
FIG. 4 is a perspective view illustrating a movement mechanism.

FIG. 4 is a perspective view illustrating the movement mechanism 16. The movement mechanism 16 includes a pressing member 42 that presses the fastening member 22 (see FIG. 3) of the fixing mechanism 14 and an actuator 44 that moves the pressing member 42. For example, the movement mechanism 16 is installed on a support pedestal 40 fixed on the side of the second surface 4b of the base 4.

The pressing member 42 includes a plate-shaped support part 42a formed into a rectangular shape and a plate-shaped pressing part 42b that protrudes forward from a side end part of the support part 42a. The support part 42a and the pressing part 42b are disposed in such a manner as to be substantially perpendicular to each other. The height of the pressing part 42b is larger than that of the support part 42a, and a lower end part of the pressing part 42b is positioned on the lower side relative to a lower surface of the support part 42a. Further, a slit (through-hole) 4c that reaches the second surface 4b from the first surface 4a is made in the base 4. The slit 4c is linearly formed along the radial direction of the holding table 6 (see FIG. 1) and penetrates the base 4 in the thickness direction. The lower end side of the pressing part 42b is inserted into the slit 4c and protrudes downward from the first surface 4a of the base 4 (see FIG. 5 and FIG. 6).

The actuator 44 is coupled to the pressing member 42. The actuator 44 is a linear actuator that moves (reciprocates) the pressing member 42 along a movement path having a straight line shape substantially parallel to the slit 4c. For example, an air cylinder is used as the actuator 44. Specifically, the actuator 44 includes a tubular cylinder 46 and a plurality of rods 48 housed in the cylinder 46. A connecting member 50 for connecting the rods 48 to another member is connected to tip parts of the plurality of rods 48. The support part 42a of the pressing member 42 is fixed to the connecting member 50 by a fixture such as a screw.

A piston (not illustrated) that segments the inside of the cylinder 46 into a first chamber and a second chamber is incorporated in the cylinder 46, and the plurality of rods 48 are fixed to the piston. Further, an air supply port 46a connected to the first chamber and an air supply port 46b connected to the second chamber are made in the cylinder 46. The air supply ports 46a and 46b are each connected to an air supply source 52 that supplies air. A valve 54a is connected between the air supply port 46a and the air supply source 52. The valve 54a controls the pressure of air supplied from the air supply source 52 to the first chamber of the cylinder 46 through the air supply port 46a. Similarly, a valve 54b is connected between the air supply port 46b and the air supply source 52. The valve 54b controls the pressure of air supplied from the air supply source 52 to the second chamber of the cylinder 46 through the air supply port 46b. For example, pressure regulators are used as the valves 54a and 54b.

When the valve 54b is opened and air is supplied to the air supply port 46b at a predetermined pressure in the state in which the valve 54a is closed and the air supply port 46a is opened to the atmosphere, the rods 48 move in such a direction as to be ejected from the cylinder 46. This causes the pressing part 42b of the pressing member 42 to move toward one end side of the slit 4c (outer circumferential edge side of the base 4). On the other hand, when the valve 54a is opened and air is supplied to the air supply port 46a at a predetermined pressure in the state in which the valve 54b is closed and the air supply port 46b is opened to the atmosphere, the rods 48 move in such a direction as to be housed in the cylinder 46. This causes the pressing part 42b of the pressing member 42 to move toward the other end side of the slit 4c (center side of the base 4).

As illustrated in FIG. 1, the holding unit 2 includes a controller (control unit, control part, control device) 60 that controls the holding unit 2. The controller 60 is connected to the constituent elements (movement mechanisms 16 and so forth) that configure the holding unit 2. The controller 60 drives the holding unit 2 by generating a control signal and outputting it to the constituent elements of the holding unit 2. For example, the controller 60 includes a computer. Specifically, the controller 60 includes a calculating section that executes various kinds of calculation necessary for driving of the holding unit 2 and a storing section that stores various kinds of information (data, program, and so forth) used for driving of the holding unit 2. The calculating section includes a processor such as a central processing unit (CPU), and the storing section includes memories such as a read only memory (ROM) and a random access memory (RAM).

Moreover, the holding unit 2 includes an informing unit (informing part, informing device) 62 that informs the operator of information. For example, the informing unit 62 is a display unit (display part, display device) that can display information and includes a touch panel-type display or the like. The controller 60 causes the informing unit 62 to display predetermined information (operation screen, message, image, and so forth) by outputting a control signal to the informing unit 62. However, there is no limitation on the kind of informing unit 62. For example, the informing unit 62 may be an indicating lamp (warning lamp) or a speaker. The indicating lamp notifies the operator of predetermined information by turning on or blinking. Further, the speaker notifies the operator of predetermined information by making sound or voice.

For example, the informing unit 62 informs the operator of the state (normal state or abnormal state) of the holding unit 2. This allows the operator to check the state of the holding unit 2 as needed, and it becomes possible to immediately deal with an abnormality when the abnormality occurs in the holding unit 2. When the holding unit 2 is mounted in a processing apparatus, a controller of the processing apparatus may double as the controller 60, and an informing unit of the processing apparatus may double as the informing unit 62.

Next, specific functions and operation of the holding unit 2 will be described. When the target object 11 is held by the holding unit 2, through outputting of a control signal to the valves 54a and 54b of the controller 60, the pressure of air supplied to the first chamber and the second chamber of the cylinder 46 is controlled, and the actuator 44 is driven.

Figure 5:
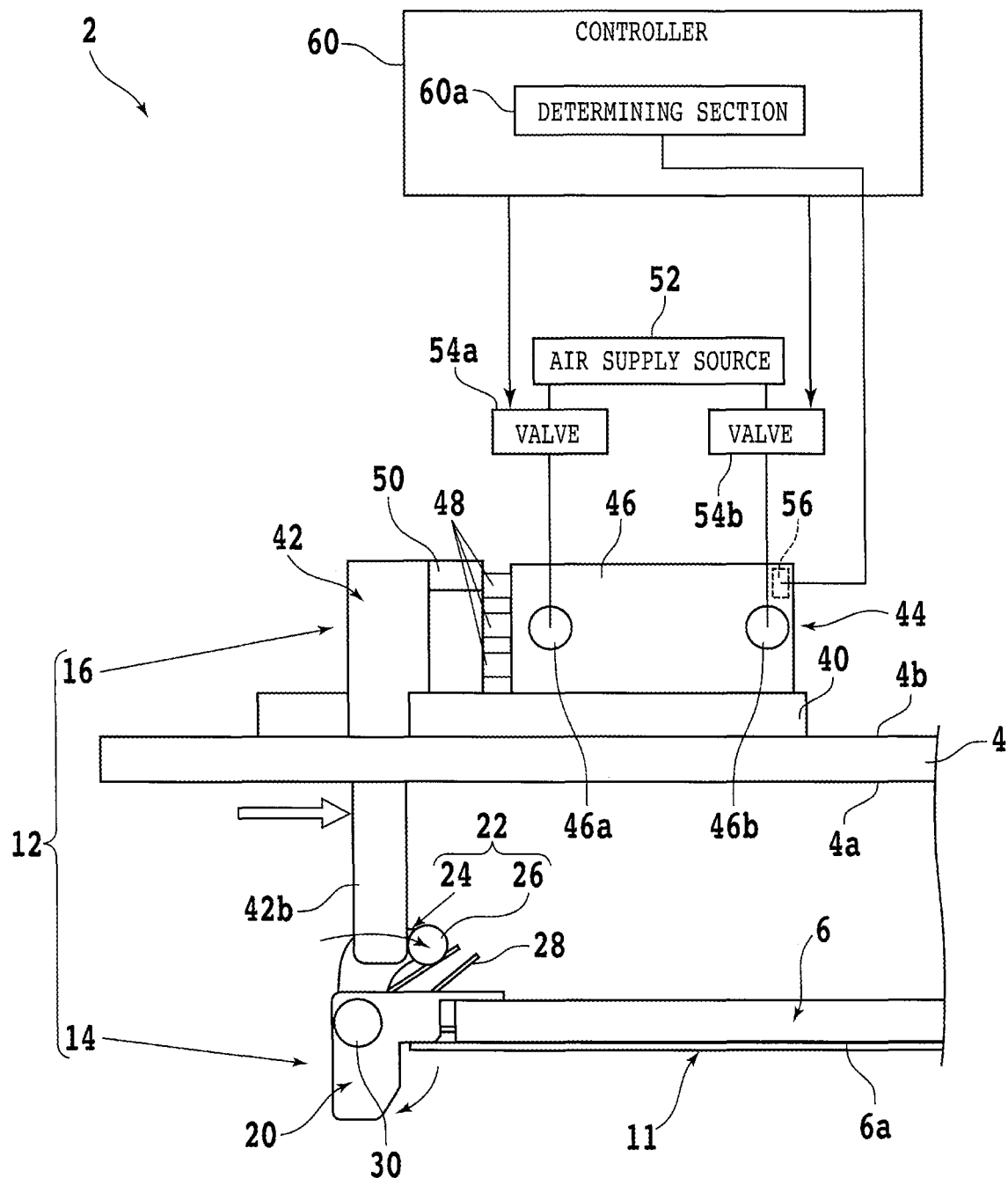
FIG. 5 is a side view illustrating the holding unit at the time of conveyance of a target object.

FIG. 5 is a side view illustrating the holding unit 2 at the time of conveyance of the target object 11. First, the valves 54a and 54b are controlled by the controller 60, air is supplied to the air supply port 46a at a predetermined pressure (for example, 0.5 MPa), and the air supply port 46b is opened to the atmosphere. This causes the rods 48 to move in such a direction as to be housed in the cylinder 46, and are positioned to a housing position. Further, the pressing part 42b of the pressing member 42 moves to press the pressed pin 26. When the pressing part 42b of the pressing member 42 presses the pressed pin 26, the fastening member 22 rotates against the biasing force of the biasing member 28 due to a force applied from the pressing member 42. This causes the fastening member 22 to be disposed at a position at which the fastening member 22 releases the target object 11 (release position), and the contact part 24a of the fastening member 22 is housed in the fixed member 20.

Next, the target object 11 is conveyed by a conveying mechanism (not illustrated) and is positioned to the holding surface 6a of the holding table 6. When a suction force of the suction source is caused to act on the holding surface 6a in this state, the target object 11 is sucked by the holding table 6.

Figure 6:
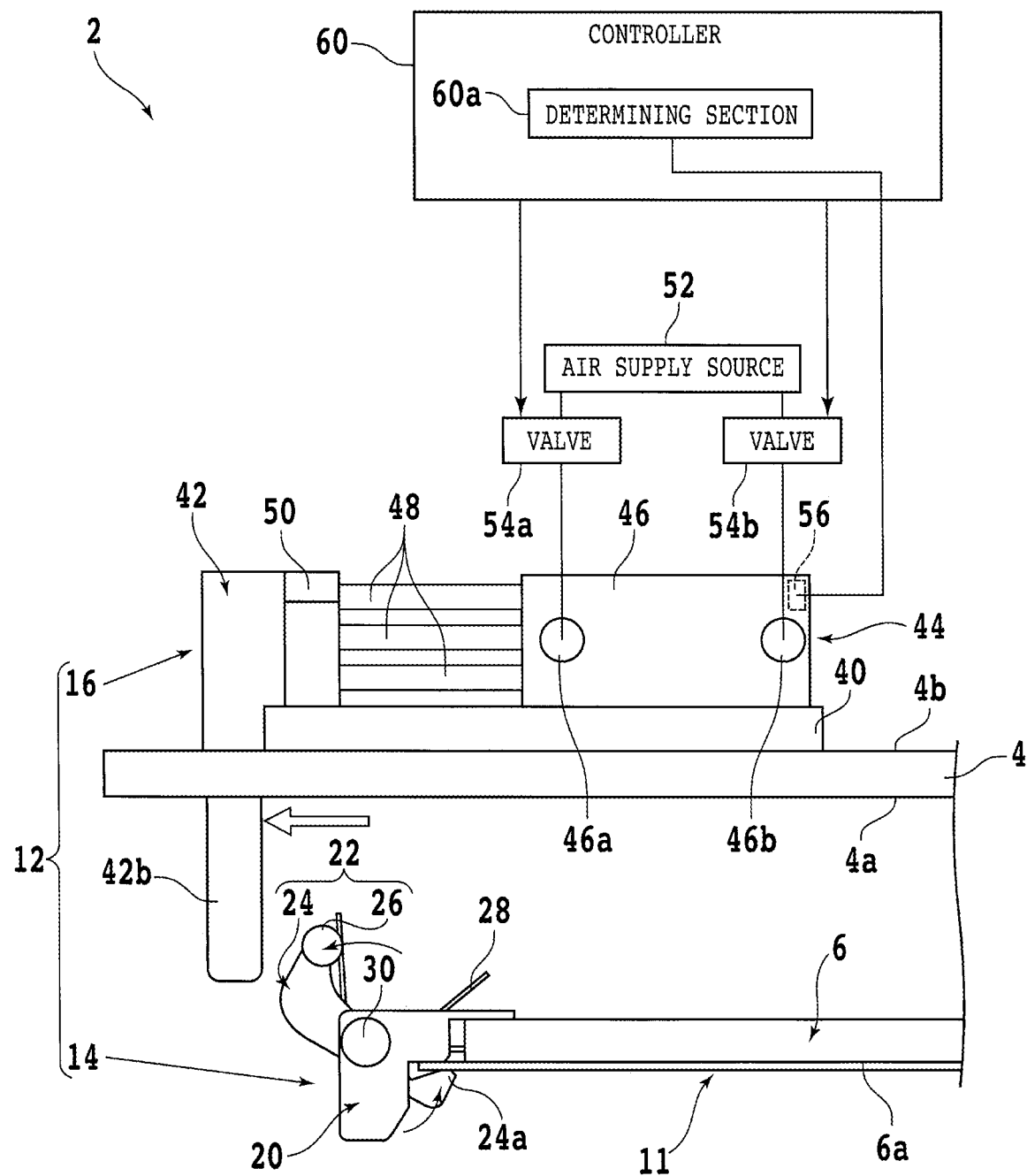
FIG. 6 is a side view illustrating the holding unit at the time of fixing of the target object.

FIG. 6 is a side view illustrating the holding unit 2 at the time of fixing of the target object 11. When the target object 11 is disposed on the holding surface 6a of the holding table 6, the valves 54a and 54b are controlled by the controller 60, the air supply port 46a is opened to the atmosphere, and air is supplied to the air supply port 46b at a predetermined pressure (for example, 0.5 MPa). This causes the rods 48 to move in such a direction as to be ejected from the cylinder 46 and are positioned to an ejection position. Moreover, the pressing part 42b of the pressing member 42 moves and separates from the pressed pin 26. When the pressing part 42b of the pressing member 42 separates from the pressed pin 26, the fastening member 22 is biased to rotate by the biasing force (restoring force) applied from the biasing member 28. This causes the fastening member 22 to be disposed at a position at which the fastening member 22 fastens the target object 11 and fixes it to the holding surface 6a of the holding table 6 (fixing position), and the contact part 24a of the contact member 24 gets contact with the outer circumferential part (frame 19, see FIG. 2) of the target object 11. As a result, the outer circumferential part of the target object 11 is pressed by the contact part 24a from the lower side toward the side of the holding surface 6a and is fixed to the holding surface 6a and the fixed member 20.

In this manner, the outer circumferential part of the target object 11 is grasped and fixed by the clamp mechanism 12, and the target object 11 is held by the holding surface 6a of the holding table 6. Thereafter, the conveying mechanism separates from the target object 11.

When the target object 11 is conveyed from the holding table 6, first, the target object 11 is supported by the conveying mechanism (not illustrated) from the lower side. Then, the suction force of the suction source acting on the holding surface 6a is deactivated. Next, the rods 48 are housed in the cylinder 46 and are positioned to the housing position, and the fastening member 22 is disposed at the release position (see FIG. 5). This causes the contact part 24a of the contact member 24 to separate from the outer circumferential part of the target object 11 and be housed in the fixed member 20. As a result, the pressing of the target object 11 by the fastening member 22 is deactivated, and the target object 11 is released. Thereafter, the target object 11 is conveyed from the holding table 6 to a predetermined place by the conveying mechanism.

If deterioration over time or breakdown occurs in the biasing member 28, a sufficient biasing force is not applied from the biasing member 28 to the fastening member 22, and the fixing of the target object 11 by the clamp mechanism 12 becomes incomplete. As a result, the target object 11 is not properly held in processing or cleaning, and processing failure or cleaning failure occurs, in some cases. In particular, when the holding table 6 holds the target object 11 with the target object 11 oriented downward as illustrated in FIG. 6, there is a possibility that the target object 11 drops due to an abnormality of the clamp mechanism 12 and damage that is impossible to repair is caused in the target object 11. As such, in the present embodiment, the state of the biasing member 28 is determined based on the pressing force of the actuator 44 that moves the fastening member 22. This can immediately find an abnormality of the clamp mechanism 12 and prevent the occurrence of the situation in which processing, cleaning, or the like of the target object 11 is continued with fixing of the target object 11 remaining incomplete.

The determination on the state of the biasing member 28 is executed by the controller 60. The controller 60 includes a determining section 60a that determines the state of the biasing member 28. The determining section 60a determines whether the biasing member 28 is in a normal state or in an abnormal state on the basis of the pressing force applied to the fastening member 22 by the actuator 44 when the fastening member 22 is moved from the fixing position to the release position.

Specifically, a signal corresponding to the pressing force applied to the fastening member 22 by the actuator 44 (pressing force signal) is input to the determining section 60a. For example, the pressure of air supplied from the air supply source 52 to the first chamber of the cylinder 46 through the valve 54a and the air supply port 46a is equivalent to the pressing force that moves the rods 48 from the ejection position to the housing position, that is, the pressing force that moves the fastening member 22 from the fixing position to the release position. Further, the controller 60 controls the valve 54a to cause the air to be supplied to the first chamber of the cylinder 46 at a predetermined pressure, and inputs a signal indicating the predetermined pressure to the determining section 60a as the pressing force signal. Moreover, a signal corresponding to the position of the fastening member 22 (position signal) is input to the determining section 60a. For example, a sensor 56 that detects the position of the rods 48 is incorporated in the cylinder 46. The sensor 56 detects the rods 48 when the rods 48 are positioned to the housing position (see FIG. 5).

When predetermined air is supplied from the air supply source 52 to the first chamber of the cylinder 46 through the valve 54a and the air supply port 46a, the rods 48 move from the ejection position (see FIG. 6) to the housing position (see FIG. 5) and are housed in the cylinder 46. Further, the fastening member 22 is pressed by the pressing member 42 and rotates to move from the fixing position (see FIG. 6) to the release position (see FIG. 5). As a result, the rods 48 are detected by the sensor 56. That is, the sensor 56 detects that the rods 48 are positioned to the housing position and that the fastening member 22 is positioned to the release position. Then, the sensor 56 inputs a signal indicating a detection result to the determining section 60a as the position signal.

As the sensor 56, for example, a magnetic sensor (magnetic cylinder sensor) is used. In this case, the sensor 56 identifies the positions of the rods 48 by detecting a magnetic field of a magnet incorporated in each of the rods 48. However, there is no limitation on the kind of sensor 56. For example, the sensor 56 may be an optical sensor that detects the rods 48 when the rods 48 come close to the sensor 56. Further, the sensor 56 may be a switch such as a touch switch or a push button. In this case, when the rods 48 get contact with the switch, the switch is actuated, and the rods 48 are detected. The sensor 56 may detect that the fastening member 22 is positioned to the release position, by detecting, instead of the rods 48, the piston housed in the cylinder 46. Moreover, a sensor that directly detects the fastening member 22 positioned to the release position may be installed instead of the sensor 56 that detects the piston of the actuator 44 or the rods 48.

Further, the determining section 60a determines whether the biasing member 28 is in the normal state or in the abnormal state on the basis of the pressure of air supplied to the actuator 44 and the position of the fastening member 22. Specifically, first, the controller 60 actuates the sensor 56 to make the state in which the rods 48 can be detected. Next, the controller 60 outputs a control signal to the valve 54a to supply air from the valve 54a to the first chamber of the cylinder 46 through the air supply port 46a at a predetermined pressure. At the time of normal driving of the actuator 44, the pressure of the air supplied from the valve 54a to the first chamber of the cylinder 46 is set to a pressure (basis pressure) that allows the fastening member 22 to move from the fixing position (see FIG. 6) to the release position (see FIG. 5) against the basing force (restoring force) of the biasing member 28 that is normal. On the other hand, when inspection of the state of the biasing member 28 is executed, air is supplied from the valve 54a to the first chamber of the cylinder 46 at a pressure (reference pressure) lower than the basis pressure. For example, when the basis pressure is set to 0.5 MPa, the reference pressure can be set lower than 0.5 MPa (0.1 MPa or the like).

Here, in a case in which the biasing member 28 is in the normal state and the biasing force (restoring force) of the biasing member 28 normally acts, movement of the fastening member 22 and the pressing member 42 is hindered by the biasing force of the biasing member 28 even when air is supplied to the first chamber of the cylinder 46 at the reference pressure. As a result, the rods 48 are not housed in the cylinder 46 and are not detected by the sensor 56. On the other hand, if deterioration over time or breakdown occurs in the biasing member 28, the biasing member 28 enters the abnormal state, and the biasing force (restoring force) of the biasing member 28 lowers or becomes unable to act. Thus, even when the pressure of air supplied to the first chamber of the cylinder 46 is the reference pressure, the fastening member 22 and the pressing member 42 move against the biasing force of the biasing member 28, and the rods 48 are housed in the cylinder 46. As a result, the rods 48 are detected by the sensor 56.

As such, the determining section 60a determines the state of the biasing member 28 on the basis of whether or not the rods 48 are detected by the sensor 56 when air is supplied from the valve 54a to the cylinder 46 at the reference pressure. Specifically, the determining section 60a determines that the biasing member 28 is in the normal state, if a signal indicating that the rods 48 are detected is not input from the sensor 56 when air is supplied from the valve 54a to the cylinder 46 at the reference pressure. On the other hand, the determining section 60a determines that the biasing member 28 is in the abnormal state, if a signal indicating that the rods 48 are detected is input from the sensor 56 when air is supplied from the valve 54a to the cylinder 46 at the reference pressure.

The operator is informed of the result of the determination made by the determining section 60a, by the informing unit 62 (see FIG. 1). For example, when the informing unit 62 is a display, the controller 60 outputs a control signal to the informing unit 62 to cause the informing unit 62 to display a message or the like indicating the determination result. This immediately notifies the operator of an abnormality of the biasing member 28.

The contents of specific processing for determining the state of the biasing member 28 can freely be set. For example, the controller 60 may control the valve 54a in a stepwise manner and supply the reference pressure that sequentially increases or decreases to the cylinder 46. Specifically, when the basis pressure is 0.5 MPa, the reference pressure that rises from 0.1 to 0.4 MPa by increments of 0.1 MPa may be supplied to the cylinder 46 in the state in which the sensor 56 is actuated. In this case, whether or not the rods 48 are detected by the sensor 56 is determined for each value of the reference pressure that sequentially changes. As a result, the degree of pressure of air supplied to the cylinder 46 when the rods 48 reach the housing position is identified, and it becomes possible to evaluate the degree of deterioration of the biasing member 28 (lowering of the biasing force). Further, the timing when inspection of the biasing member 28 is executed can also freely be set. For example, the state of the biasing member 28 is determined in a period from unloading of one target object 11 from the holding unit 2 to holding of the next target object 11 by the holding unit 2. This can check the state of the biasing member 28 in advance every time the target object 11 is held by the holding unit 2. Moreover, when the holding unit 2 is mounted in a processing apparatus, inspection of the biasing member 28 may be executed at the time of maintenance of the processing apparatus.

As above, in the holding unit 2 according to the present embodiment, whether the biasing member 28 is in the normal state or in the abnormal state is determined based on the pressing force of the actuator 44, the pressing force being applied when the fastening member 22 is moved from the fixing position to the release position. This can immediately find an abnormality of the biasing member 28 and prevent the occurrence of the situation in which processing, cleaning, or the like of the target object 11 is continued with fixing of the target object 11 remaining incomplete.

In the present embodiment, description has been made about the example in which the holding unit 2 holds the target object 11 with the target object 11 oriented downward (see FIG. 2). However, the holding unit 2 may hold the target object 11 with the target object 11 oriented upward. Specifically, it is also possible to dispose the holding table 6 and the plurality of fixing mechanisms 14 on the side of the second surface 4b of the base 4 and dispose the plurality of movement mechanisms 16 on the side of the first surface 4a of the base 4.

Further, there is no limitation on the use purpose of the holding unit 2 according to the present embodiment. For example, the holding unit 2 is mounted in various kinds of processing apparatuses such as a cutting apparatus, a grinding apparatus, a polishing apparatus, and a laser processing apparatus.

The cutting apparatus includes a processing unit (cutting unit) that cuts a workpiece. The cutting unit includes a spindle, and an annular cutting blade is mounted on a tip part of the spindle. The workpiece is cut by causing the cutting blade to cut into the workpiece while the cutting blade is rotated.

The grinding apparatus includes a processing unit (grinding unit) that grinds a workpiece. The grinding unit includes a spindle, and an annular grinding wheel including a plurality of grinding abrasive stones is mounted on a tip part of the spindle. The workpiece is ground by bringing the grinding abrasive stones into contact with the workpiece while the grinding wheel is rotated.

The polishing apparatus includes a processing unit (polishing unit) that polishes a workpiece. The polishing unit includes a spindle, and a polishing pad with a circular disc shape is mounted on a tip part of the spindle. The workpiece is polished by bringing the polishing pad into contact with the workpiece while the polishing pad is rotated.

The laser processing apparatus includes a processing unit (laser irradiation unit) that irradiates a workpiece with a laser beam. The laser irradiation unit includes a laser oscillator that oscillates a laser with a predetermined wavelength and an optical system that guides, to the workpiece, the laser beam emitted from the laser oscillator. Laser processing is executed for the workpiece by irradiating the workpiece with the laser beam from the laser irradiation unit.

Further, it is also possible to mount the holding unit 2 in a plasma treatment apparatus that executes plasma etching for a workpiece. The plasma treatment apparatus executes etching of the workpiece by supplying an etching gas in a plasma state to the workpiece.

A chuck table that holds a workpiece in processing of the workpiece and a spinner table that holds the workpiece and rotates in cleaning of the workpiece are mounted in a processing apparatus such as the ones described above. Moreover, the holding unit 2 according to the present embodiment can be used as the chuck table and the spinner table mounted in the processing apparatus.

Besides, structures, methods, and so forth according to the above-described embodiment can be carried out with appropriate changes without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A holding unit that holds a target object by a holding surface of a holding table, the holding unit comprising:
    a base having a first and second side surface and a slot formed through the first and second side surfaces;
    a fixing mechanism spaced away from the first side surface of the base that fixes the target object to the holding surface of the holding table, the fixing mechanism including:
    a fastening member configured to fix and release the target object to the holding surface, wherein the fastening member has a biasing member that biases the fastening member toward a fixing position, wherein at the fixing position the fastening member fastens the target object and fixes the target object to the holding surface;
    a movement mechanism mounted to the second side surface of the base that moves the fixing mechanism toward a release position at which the fastening member releases the target object, the movement mechanism including:
    a pressing member that extends through the slot from the first side surface to the second side surface of the base and presses the fastening member, and
    an actuator that moves the pressing member in a linear direction parallel to the first side surface of the base to position the fastening member into the release position; and
    a controller, wherein the controller determines whether the biasing member is biasing the fastening member in the fixing position or in the release position, wherein a detected pressing force of the pressing member is based on the pressure of a fluid applied to the actuator, the pressing force being applied when the fastening member is moved from the fixing position to the release position.

2. The holding unit according to claim 1, wherein
the biasing member is a helical torsion spring, and
the actuator is an air cylinder.

* * * * *